United States Patent
Bae et al.

(10) Patent No.: US 9,578,753 B2
(45) Date of Patent: Feb. 21, 2017

(54) METHOD FOR MANUFACTURING DISPLAY DEVICE

(71) Applicant: Samsung Display Co., Ltd., Yongin (KR)

(72) Inventors: Sung-Dae Bae, Seoul (KR); Myoung-Soo Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 361 days.

(21) Appl. No.: 14/463,259

(22) Filed: Aug. 19, 2014

(65) Prior Publication Data

US 2015/0230347 A1  Aug. 13, 2015

(30) Foreign Application Priority Data

Feb. 12, 2014 (KR) .................. 10-2014-0016047

(51) Int. Cl.
*H05K 3/36* (2006.01)
*H05K 3/00* (2006.01)

(52) U.S. Cl.
CPC ............ *H05K 3/361* (2013.01); *H05K 3/0058* (2013.01); *H05K 2201/10128* (2013.01); *H05K 2203/0165* (2013.01); *Y10T 29/49126* (2015.01)

(58) Field of Classification Search
CPC ...... H05K 3/361; H05K 3/365; H05K 3/0058; H05K 2203/0165; H05K 2201/10128; H01R 12/88; Y10T 29/49126; Y10T 29/49128; Y10T 29/4913; Y10T 29/53265
USPC .......... 29/830–832, 842, 760; 174/254, 260; 439/67
See application file for complete search history.

(56) References Cited

U.S. PATENT DOCUMENTS

| | | | | |
|---|---|---|---|---|
| 5,209,671 A | * | 5/1993 | Sugimoto | ............. H05K 3/365 439/67 |
| 7,247,034 B2 | * | 7/2007 | Matsuzaki | ............. H01R 12/88 174/254 |
| 7,573,541 B2 | | 8/2009 | Kim | |
| 2008/0068313 A1 | | 3/2008 | Jang | |
| 2011/0063261 A1 | | 3/2011 | Park et al. | |
| 2012/0075268 A1 | | 3/2012 | Chung et al. | |
| 2013/0033658 A1 | | 2/2013 | Kato et al. | |
| 2013/0100372 A1 | | 4/2013 | Wu et al. | |

FOREIGN PATENT DOCUMENTS

| | | |
|---|---|---|
| JP | 2003-029650 | 1/2003 |
| JP | 2012-168336 | 9/2012 |
| KR | 1020070056780 | 6/2007 |
| KR | 1020070062133 | 6/2007 |
| KR | 1020080018722 | 2/2008 |

* cited by examiner

*Primary Examiner* — Donghai D Nguyen
(74) *Attorney, Agent, or Firm* — H.C. Park & Associates, PLC (57) ABSTRACT

A method for manufacturing a display device includes: connecting a first printed circuit board and a second printed circuit board with a first connecting film, the first printed circuit board and the second printed circuit board configured to apply a driving signal to a display panel; attaching a fixing member to the first printed circuit board and the second printed circuit board, such that the first connecting film extends away from the display panel and the first printed circuit board is spaced apart from the display panel; attaching the second printed circuit board to the display panel with second connecting films; removing the fixing member; and attaching the first printed circuit board to the display panel.

12 Claims, 7 Drawing Sheets

METHOD FOR MANUFACTURING DISPLAY DEVICE

CROSS REFERENCE TO RELATED APPLICATION

This application claims priority from and the benefit of Korean Patent Application No. 10-2014-0016047, filed on Feb. 12, 2014, which is hereby incorporated by reference for all purposes as if fully set forth herein.

BACKGROUND

Field

Exemplary embodiments of the present invention provide a method for manufacturing a display device.

Discussion of the Background

A display device is a device for displaying images, and may include a display panel for displaying an image and a printed circuit board (PCB) for applying a driving signal for driving the display panel.

The printed circuit board (PCB) may include a PCB for receiving an image signal from an external device, and a PCB for transmitting a driving signal to the display panel. The PCBs may be connected to each other through a film. Further, the PCB for transmitting a driving signal to the display panel may be connected to the display panel through a film.

When the PCB for transmitting a driving signal to the display panel is connected to the display panel, the film connected to the PCB is attached to the display panel. However, in this configuration, the film connecting the PCB and the display panel may be interfered with by another film.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention provide a method for manufacturing a display device for preventing interference that may be caused by a film, when a printed circuit board (PCB) is connected to a display panel.

Exemplary embodiments of the present invention provide a method for manufacturing a display device, including connecting a first printed circuit board and a second printed circuit board with a first connecting film, the first printed circuit board and the second printed circuit board configured to apply a driving signal to a display panel; attaching a fixing member to the first printed circuit board and the second printed circuit board, such that the first connecting film extends away from the display panel and the first printed circuit board is spaced apart from the display panel; attaching the second printed circuit board to the display panel with second connecting films; removing the fixing member; and attaching the first printed circuit board to the display panel.

According to an exemplary embodiment of the present invention, the first printed circuit board and the first connecting film are fixed without overlapping with the display panel by use of the fixing member, and the second connecting film is attached to the display panel. In this configuration, by the first connecting film does not induce any interference when the second connecting film is attached to the display panel.

It is to be understood that both the foregoing general description and the following detailed description are exemplary and explanatory and are intended to provide further explanation of the invention as claimed.

BRIEF DESCRIPTION OF THE ILLUSTRATED EMBODIMENTS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE EMBODIMENTS

Hereinafter, exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ). Like reference numerals designate like elements throughout the specification.

Figure 1:
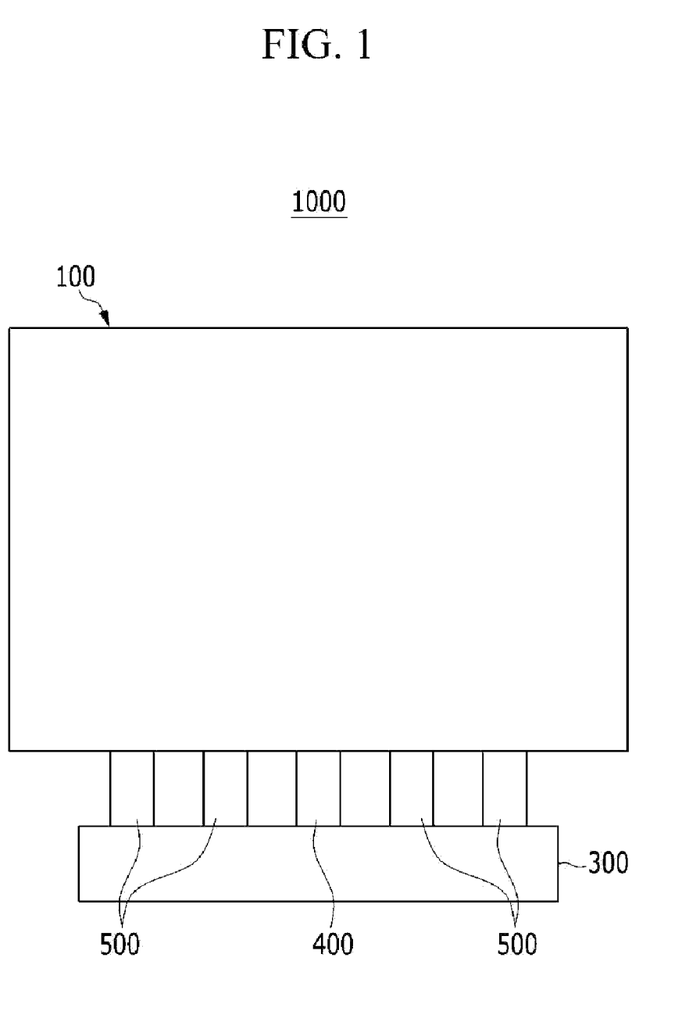
FIG. 1 shows a top plan view of a display device according to an exemplary embodiment of the present invention.
Figure 2:
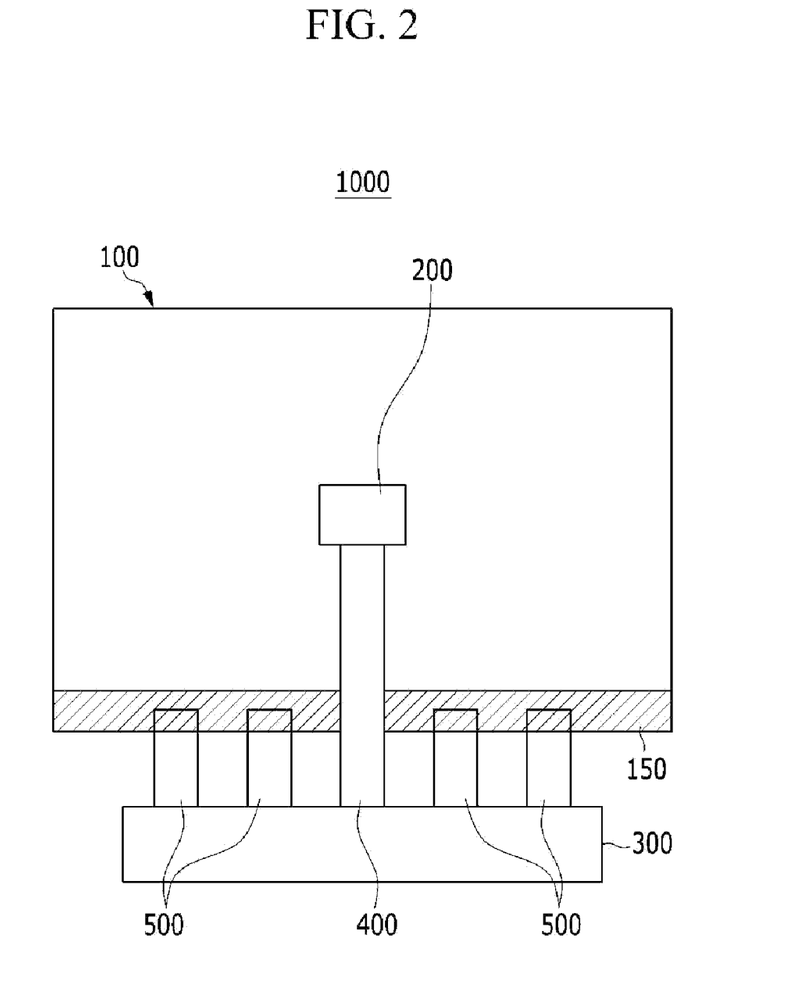
FIG. 2 shows a top plan view of a rear side of a display device of FIG. 1.

FIG. 1 shows a top plan view of a display device according to an exemplary embodiment of the present invention. FIG. 2 shows a top plan view of a rear side of a display device of FIG. 1.

Referring to FIG. 1 and FIG. 2, the display device 1000 includes a display panel 100 for displaying an image, and a first printed circuit board (PCB) 200 and a second printed circuit board (PCB) 300 for applying a driving signal to the display panel 100.

The display panel 100 may include two thin substrates that face each other and are formed with an insulating material, such as glass or plastic, and a liquid crystal layer disposed between the substrates. A thin film, which may include a plurality of thin film transistors, a plurality of data lines, a plurality of gate lines, and a plurality of pixel electrodes may be disposed on one of the substrates. Another thin film, which may include a color filter and a common electrode, may be disposed on the other substrate.

Further, the display panel 100 may include a liquid crystal layer disposed between the substrates. The display panel 100 may include an insulating material made of a transparent material. A thin film, which may include a plurality of thin film transistors, a plurality of data lines, a plurality of gate lines, and a plurality of pixel electrodes disposed on one of the substrates. A common electrode, and a color filter may be further disposed on one of the substrates. Here, the liquid crystal layer may be provided in a space between the pixel electrode and the common electrode to which a common voltage is applied.

The display panel 100 may include a substrate formed with an insulating material, such as transparent glass or plastic, and may include a plurality of organic light emitting diodes. A thin film, including a plurality of thin film transistors, a plurality of gate lines, and a plurality of data lines may be disposed on the substrate. The display panel 100 may also include an encapsulation substrate that is disposed on the thin film, which is combined by a substrate and a sealant, and operates as a sealing substrate.

Referring back to FIGS. 1 and 2, the first PCB 200 is attached to a rear side of the display panel 100, and is connected to the second PCB 300 through a first connecting film 400. The second PCB 300 is connected to the display panel 100 through a plurality of second connecting films 500. The first connecting film 400 is disposed between the second connecting films 500.

The first PCB 200 may receive an image signal from an external device and transmit a driving signal for driving the display panel 100 to the second PCB 300. The second PCB 300 may apply the driving signal provided by the first PCB 200 to the display panel 100.

The first connecting film 400 and the second connecting films 500 may be flexible and may include wires. The first connecting film 400 is longer than the second connecting films 500.

The second connecting films 500 are attached to the rear side of the display panel 100 by an adhesive film 150.

A method for manufacturing a display device according to an exemplary embodiment of the present invention will now be described with reference to FIG. 2 to FIG. 7

Figure 3:
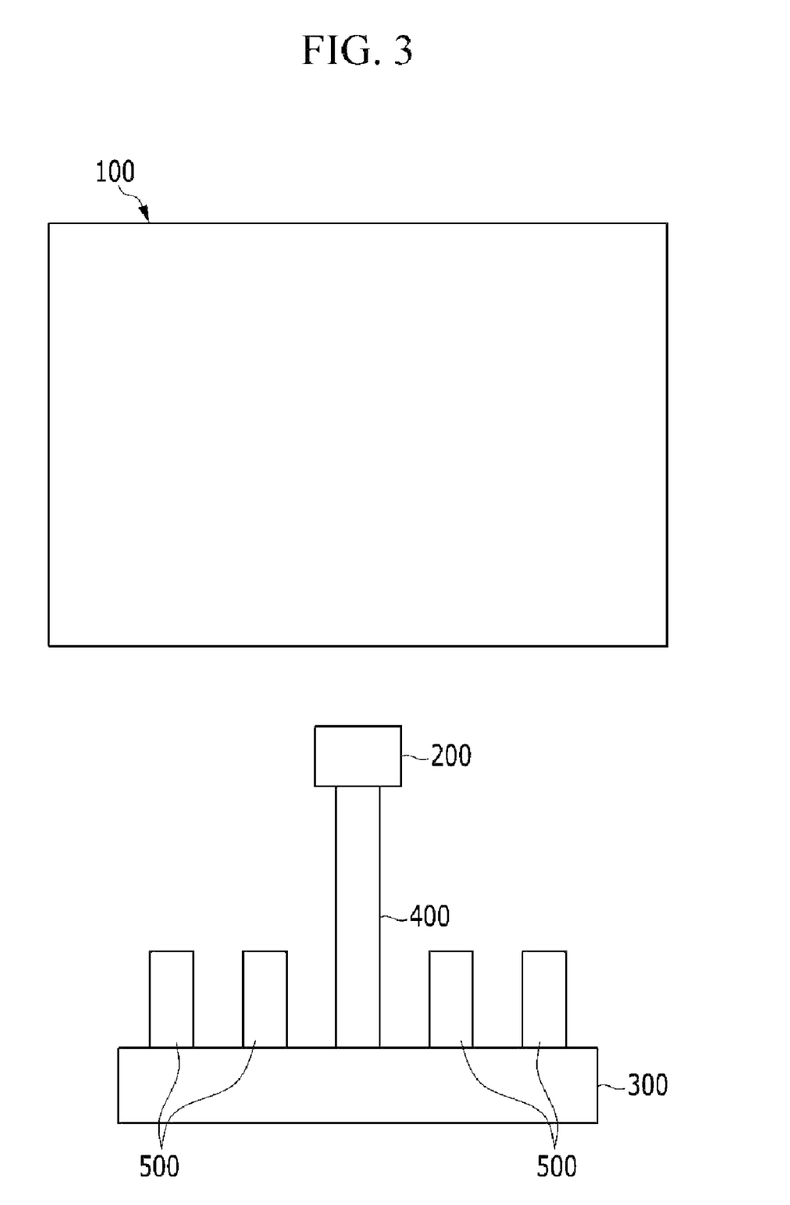
FIG. 3 and FIG. 4 show a method for manufacturing a display device according to an exemplary embodiment of the present invention.
Figure 4:
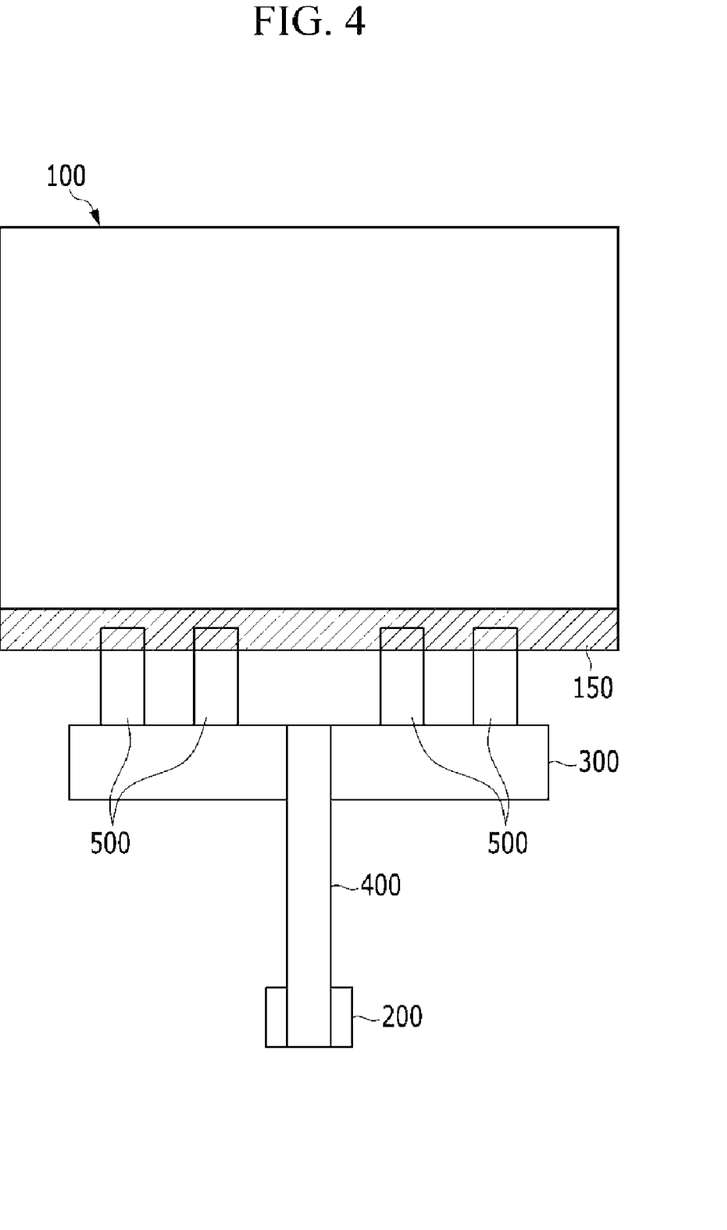
Figure 5:
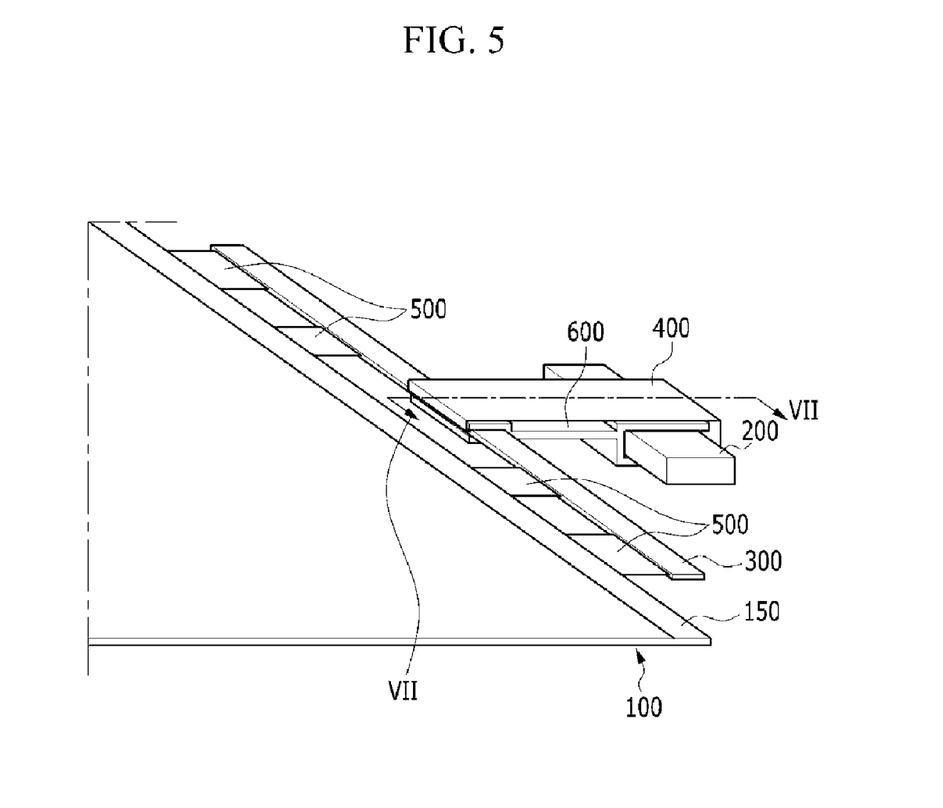
FIG. 5 shows a perspective view of a manufacturing method shown in FIG. 4.
Figure 6:
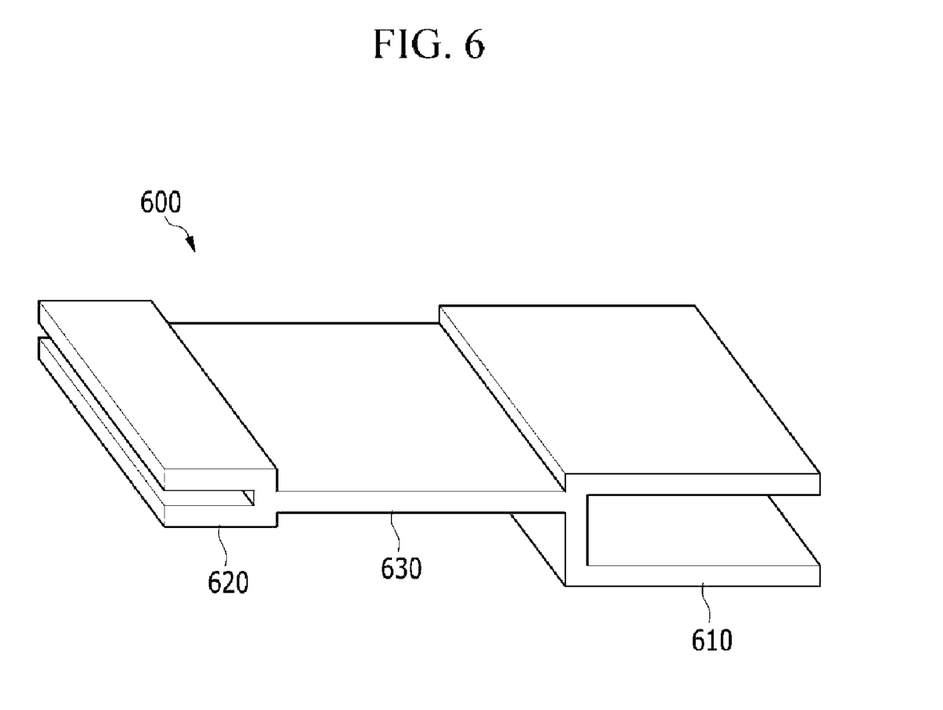
FIG. 6 shows a fixing member according to an exemplary embodiment of the present invention.
Figure 7:
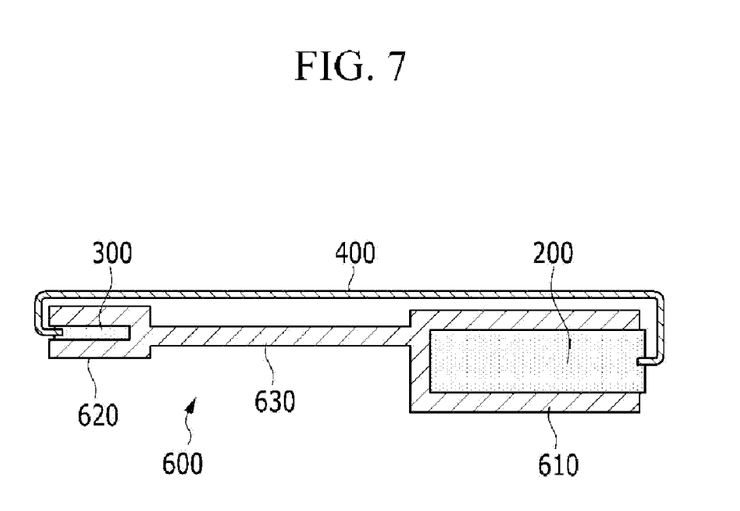
FIG. 7 shows a cross-sectional view with respect to a line VII-VII of FIG. 5.

FIG. 3 and FIG. 4 show a method for manufacturing a display device according to an exemplary embodiment of the present invention. FIG. 5 shows a perspective view of a manufacturing method shown in FIG. 4. FIG. 6 shows a fixing member according to an exemplary embodiment of the present invention. FIG. 7 shows a cross-sectional view with respect to a line VII-VII of FIG. 5.

Referring to FIG. 3, the display panel 100, the first PCB 200, and the second PCB 300 are provided, and the first PCB 200 is connected to the second PCB 300. The first PCB 200 and the second PCB 300 are connected by the first connecting film 400.

Referring to FIG. 4 to FIG. 7, the second PCB 300 is connected to the display panel 100. Here, the second PCB 300 is connected to the display panel 100 by a plurality of second connecting films 500.

The first PCB 200 and the first connecting film 400 are fixed by a fixing member 600. The plurality of second connecting films 500 are attached to the rear side of the display panel 100 by the adhesive film 150.

The first PCB 200 is connected to the second PCB 300 by the first connecting film 400. The first connecting film 400 is longer than the second connecting film 500. In this configuration, attachment of the second connecting film 500 to the rear side of the display panel 100 is interfered with by the first connecting film 400, because of flexibility of the first connecting film 400.

Therefore, the second connecting films 500 are attached to the rear side of the display panel 100 after the first PCB 200 and the first connecting film 400 are fixed, so that they do not overlap the display panel 100.

The first connecting film 400 may be fixed in a folded position using an adhesive film, so that it does not overlap the display panel 100. However, when the adhesive film is removed, an adhesive material of the adhesive film remains on the first connecting film 400.

In the present exemplary embodiment, however, the fixing member 600 is used to fix the first PCB 200 and the first connecting film 400 so they do not overlap with the display panel 100, and the second connecting films 500 are then attached to the rear side of the display panel 100.

The fixing member 600 includes a first settler 610, a second settler 620, and a connector 630 connecting the first settler 610 and the second settler 620.

The first settler 610 and the second settler 620 are U-shaped and may be flexible. The first settler 610 is bigger than the second settler 620. Further, an extended line on an upper side of the first settler 610 and an extended line on an upper side of the second settler 620 are provided on a same line. That is, the upper surfaces of the first and second settlers are on the same horizontal plane as one another.

When the first PCB 200 and the first connecting film 400 are fixed by the fixing member 600, the PCB 200 is held by the first settler 610, and the second PCB 300 is held by the second settler 620. The first connecting film 400 is provided on the fixing member 600.

Therefore, the first PCB 200 and the first connecting film 400 do not overlap the display panel 100. When the second connecting films 500 are attached to the rear side of the display panel 100, the first connecting film 400 does not cause any interference with the process.

Since the first settler 610 and the second settler 620 may be flexible, it is easy to dispose the first PCB 200 and second PCB 300 in the first settler 610 and the second settler 620.

Referring back to FIG. 2, the fixing member 600 is removed and the first PCB 200 is attached to the rear side of the display panel 100.

Accordingly, the second PCB 300 is connected to the display panel 100 by the second connecting films 500, the fixing member 600 is used to fix the first PCB 200 and the first connecting film 400 to the display panel 100, and the second connecting films 500 are attached to the display panel 100. Accordingly, in an exemplary embodiment of the present invention, the first connecting film 400 is held in position so as not to interfere with the attachment of the second connecting films 500 to the display panel 100.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a display device, comprising:

connecting a first printed circuit board and a second printed circuit board with a first connecting film, the first printed circuit board and the second printed circuit board configured to apply a driving signal to a display panel;

attaching a fixing member to the first printed circuit board and the second printed circuit board, such that the first connecting film extends away from the display panel and the first printed circuit board is spaced apart from display panel;

attaching the second printed circuit board to the display panel with second connecting films;

removing the fixing member; and attaching the first printed circuit board to the display panel.

2. The method of claim 1, wherein the fixing member comprises:
   a first settler configured to hold the first printed circuit board;
   a second settler configured to hold the second printed circuit board; and
   a connector connecting the first settler and the second settler.

3. The method of claim 2, wherein the first settler and the second settler are U-shaped.

4. The method of claim 3, wherein the first settler and the second settler comprise a flexible material.

5. The method of claim 4, wherein the first settler is larger than the second settler.

6. The method of claim 5, wherein the attachment of the fixing member comprises:

disposing the first printed circuit board in the first settler;
disposing the second printed circuit board in the second settler; and
aligning the first connecting film with the fixing member.

7. The method of claim 5, wherein the fixing of first connecting film and the first printed circuit board by using the fixing member comprises:
   disposing the second settler on an opposite side of the display panel with respect to the second printed circuit board.

8. The method of claim 1, wherein the first connecting film and the second connecting films comprise a flexible material.

9. The method of claim 8, wherein the first connecting film is longer than each of the second connecting films.

10. The method of claim 9, wherein the first connecting film is disposed between two of the second connecting films.

11. The method of claim 1, wherein the attaching of the first printed circuit board to the display panel comprises attaching the first printed circuit board to the display panel with an adhesive film.

12. The method of claim 1, wherein:
   the first printed circuit board is configured to receive an image signal from an external device and transmit a driving signal for driving the display panel to the second printed circuit board; and
   the second printed circuit board is configured to apply the driving signal to the display panel.

* * * * *